(12) United States Patent
Chen et al.

(10) Patent No.: US 9,972,534 B1
(45) Date of Patent: May 15, 2018

(54) SEMICONDUCTOR DEVICES, THROUGH-SUBSTRATE VIA STRUCTURES AND METHODS FOR FORMING THE SAME

(71) Applicant: Vanguard International Semiconductor Corporation, Hsinchu (TW)

(72) Inventors: Li-Che Chen, Hsinchu (TW); Tzu-Hsuan Chen, Taipei (TW); Hsing-Chao Liu, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days. days.

(21) Appl. No.: 15/613,663

(22) Filed: Jun. 5, 2017

(51) Int. Cl.
| | |
|---|---|
| *H01L 21/4763* | (2006.01) |
| *H01L 21/44* | (2006.01) |
| *H01L 29/40* | (2006.01) |
| *H01L 21/768* | (2006.01) |
| *H01L 23/48* | (2006.01) |
| *H01L 21/304* | (2006.01) |

(52) U.S. Cl.
CPC ...... *H01L 21/76898* (2013.01); *H01L 21/304* (2013.01); *H01L 21/76843* (2013.01); *H01L 23/481* (2013.01)

(58) Field of Classification Search
CPC ......... H01L 21/76802; H01L 21/76843; H01L 21/31144; H01L 21/76808; H01L 21/76807; H01L 21/76813; H01L 21/76831; H01L 21/76897; H01L 21/76804; H01L 21/31116

USPC ................. 438/637–640, 672, 675
See application file for complete search history.

(56) References Cited

U.S. PATENT DOCUMENTS

| | | | |
|---|---|---|---|
| 2006/0030146 A1* | 2/2006 | Helm | H01L 21/76895 438/640 |
| 2010/0171223 A1* | 7/2010 | Kuo | H01L 21/76898 257/773 |
| 2011/0272013 A1* | 11/2011 | Moslehi | H01L 31/042 136/255 |
| 2012/0142145 A1* | 6/2012 | Abe | H01L 21/76898 438/107 |
| 2012/0187546 A1* | 7/2012 | Akinmade-Yusuff | H01L 21/31144 257/622 |

FOREIGN PATENT DOCUMENTS

| | | |
|---|---|---|
| TW | 201403768 A | 1/2014 |
| TW | 201511202 A | 3/2015 |

\* cited by examiner

*Primary Examiner* — Hsien Ming Lee
(74) *Attorney, Agent, or Firm* — Birch, Stewart, Kolasch & Birch, LLP

(57) ABSTRACT

A semiconductor device includes a through-substrate via structure, a first metal layer, an electronic component over the through-substrate via structure, a second metal layer and another electronic component below the through-substrate via structure. The through-substrate via structure includes a through hole penetrating from a first surface to an opposite second surface of a semiconductor substrate, and an acute angle is included between a sidewall of the through hole and the second surface on a side of the semiconductor substrate. The through-substrate via structure also includes a conductive layer that fills the through hole, and a semiconductor layer disposed in the through hole and interposed between the conductive layer and the semiconductor substrate.

15 Claims, 5 Drawing Sheets

SEMICONDUCTOR DEVICES, THROUGH-SUBSTRATE VIA STRUCTURES AND METHODS FOR FORMING THE SAME

BACKGROUND OF THE INVENTION

Field of the Invention

The invention relates to semiconductor devices, and in particular to through-substrate via structures of semiconductor devices and methods for forming the same.

Description of the Related Art

In traditional two-dimensional (2D) manufacturing processes, metal wires are routed through various structural layers in order to connect two devices. This can induce signal decay and increase costs. Therefore, to overcome these problems, three-dimensional (3D) integrated circuit (IC) semiconductor technology has been developed, of which one of the key technologies is the through silicon via (TSV). By using through silicon via technology to replace traditional long-distance metal wires, the stacked chips are conducted vertically, and the ways in which the signals are transmitted have been changed from horizontally to vertically. As a result, the chip stacking density can be increased, the volume of the devices can be decreased, power consumption can be decreased, signal transmission speeds can be improved, and last but not least, the product efficiency can be increased. The through silicon via technology is widely applied in several areas.

Although existing through-substrate via structures and methods for forming the same have been adequate for their intended purposes, they have not been entirely satisfactory in all respects. Therefore, up to the present, there are still some problems that can be overcome in through-substrate via structures technology.

BRIEF SUMMARY OF THE INVENTION

Embodiments of through-substrate via structures and methods for forming the same are provided. The production of the voids inside the material filling the through hole can be reduced by the through hole with a tapered angle. Moreover, in the past while performing the planarization process on the bottom surface of the semiconductor substrate, which is also called the back grinding (BG) process, since the materials inside and outside of the through hole are so different, the conductive layer in the through hole may protrude outside of the semiconductor substrate because of uneven stress distribution and different etching selectivity to the grinding fluid, resulting in the uneven surface of the semiconductor substrate after performing the planarization process. The foregoing problem can be solved by disposing the semiconductor layer in the through hole and between the conductive layer and the semiconductor substrate.

Some embodiments of the disclosure provide a through-substrate via structure. The through-substrate via structure includes a through hole penetrating from a first surface to an opposite second surface of a semiconductor substrate, and an acute angle is included between the sidewall of the through hole and the second surface on a side of the semiconductor substrate. The through-substrate via structure further includes a conductive layer that fills in the through hole, and a semiconductor layer disposed in the through hole and interposed between the conductive layer and the semiconductor substrate.

Some embodiments of the disclosure provide a semiconductor device. The semiconductor device includes a through hole penetrating from a first surface to an opposite second surface of a semiconductor substrate, and an acute angle is included between the sidewall of the through hole and the second surface on a side of the semiconductor substrate. The semiconductor device also includes a conductive layer that fills in the through hole. The semiconductor device further includes a semiconductor layer disposed in the through hole and interposed between the conductive layer and the semiconductor substrate. In addition, the semiconductor device includes a first metal layer attached to the first surface and electrically connected to an electronic component, and a second metal layer attached to the second surface and electrically connected to another electronic component.

Some embodiments of the disclosure provide a method for forming a through-substrate via structure. The method includes forming a hole in a semiconductor substrate, forming a semiconductor layer on a sidewall and a bottom surface of the hole, forming a conductive layer on the semiconductor layer and the semiconductor substrate, wherein the conductive layer fills the hole. The method further includes performing a first planarization process on a top surface of the semiconductor substrate to remove the conductive layer outside of the hole, and performing a second planarization process on a bottom surface of the semiconductor substrate to remove a portion of the semiconductor substrate, such that a surface of the semiconductor substrate is coplanar with the semiconductor layer on the bottom surface of the hole, wherein an acute angle is included between the sidewall of the hole and the surface of the semiconductor substrate on a side of the semiconductor substrate.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION OF THE INVENTION

Figure 1:
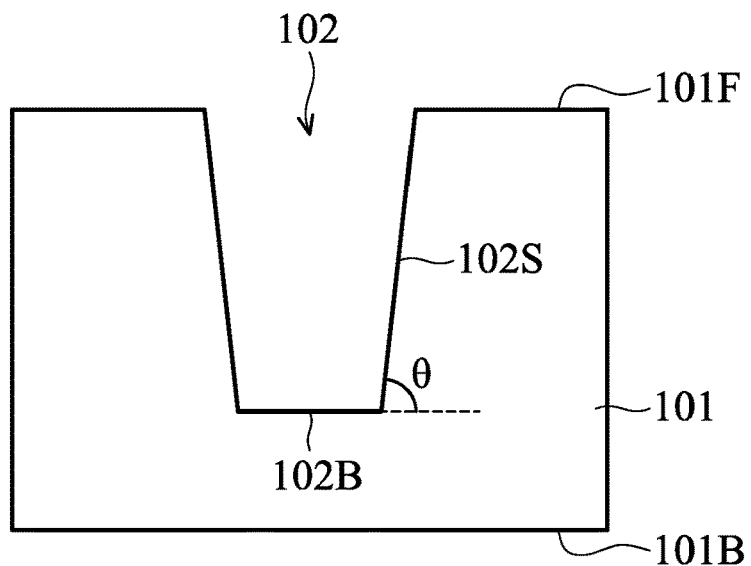
FIGS. 1 to 8 are cross-sectional views illustrating an exemplary sequential formation process of a through-substrate via structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like features. It should be understood that additional operations can be provided before, during, and after the method, and some of the operations described can be replaced or eliminated for other embodiments of the method.

Embodiments for forming a through-substrate via structures are provided. FIGS. 1 to 8 are cross-sectional views illustrating an exemplary sequential forming process of the through-substrate via structure 100 shown in FIG. 8 in accordance with some embodiments.

As shown in FIG. 1, a hole 102 is formed in the semiconductor substrate 101, in accordance with some embodiments. The semiconductor substrate 101 may be made of silicon or another semiconductor material. Alternatively, the semiconductor substrate 101 may include other elementary semiconductor materials such as germanium (Ge). In some embodiments, the semiconductor substrate 101 is made of a compound semiconductor such as silicon carbide (SiC), gallium nitride (GaN), gallium arsenic (GaAs), indium arsenide (InAs), or indium phosphide (InP). In some embodiments, the semiconductor substrate 101 is made of an alloy semiconductor such as silicon germanium, silicon germanium carbide, gallium arsenic phosphide, or gallium indium phosphide. In some embodiments, the semiconductor substrate 101 may include a silicon-on-insulator (SOI) substrate. In some embodiments, the semiconductor substrate 101 includes an epitaxial layer, for example, the semiconductor substrate 101 has an epitaxial layer overlying a bulk semiconductor. In some embodiments, the semiconductor substrate 101 may be a lightly doped p-type or n-type substrate.

Next, as shown in FIG. 1, the hole 102 may be formed by any applicable processes, such as photolithography and etching processes. It is important to note that the hole 102 is extended from a top surface 101F of the semiconductor substrate 101 toward a bottom surface 101B of the semiconductor substrate 101, but not extended to the bottom surface 101B of the semiconductor substrate 101. Moreover, an acute angle 9 is included between a sidewall 102S of the hole 102 and an extended dashed line of a bottom surface 102B of the hole 102 at a side of the semiconductor substrate 101. In other words, the hole 102 has a tapered cross-section from the top surface 101F toward the bottom surface 102B. In some embodiments, the acute angle 9 is in a range from about 60 degrees to about 88 degrees, and the aspect ratio of the hole 102 is more than about 20.

Figure 2:
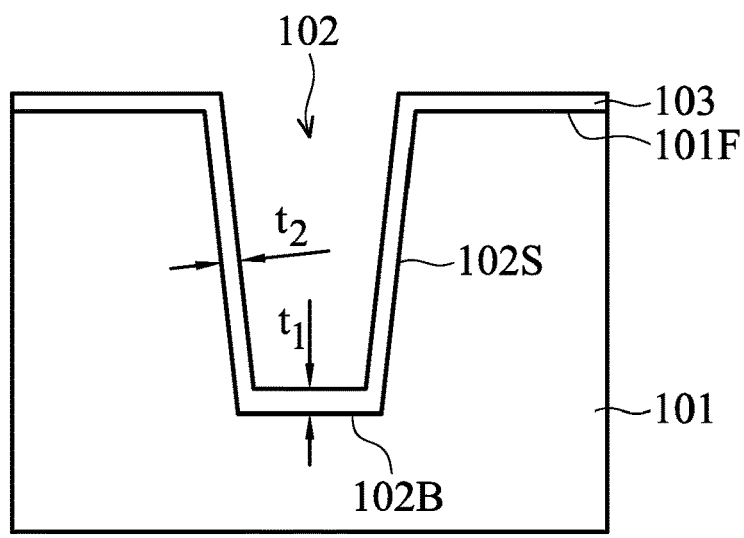

As shown in FIG. 2, in accordance with some embodiments, a semiconductor layer 103 is formed on the sidewall 102S and the bottom surface 102B of the hole 102, and on the top surface 101F of the semiconductor substrate 101. In some embodiments, the material of the semiconductor layer 103 may be polysilicon or silicon oxide, and the semiconductor layer 103 may be formed by using a chemical vapor deposition (CVD) process, a flowable chemical vapor deposition (FCVD) process, an atomic layer deposition (ALD) process, a low-pressure chemical vapor deposition (LPCVD) process, a plasma enhanced chemical vapor deposition (PECVD) process, another applicable process, or a combination thereof.

In some embodiments, as shown in FIG. 2, the portion of the semiconductor layer 103 on the bottom surface 102B of the hole 102 has a thickness $t_1$, and the portion of the semiconductor layer 103 on the sidewall 102S of the hole 102 has a thickness $t_2$, the thickness $t_1$ is greater than the thickness $t_2$, so that during the subsequent second planarization process, which is also called bottom grinding process, the portion of the semiconductor layer 103 on the bottom surface 102B of the hole 102 can prevent the conductive layer 107 in the hole 102 from protruding, not to mention that the problem of the protruding conductive layer 107 being scratch can also be prevented.

Figure 3:
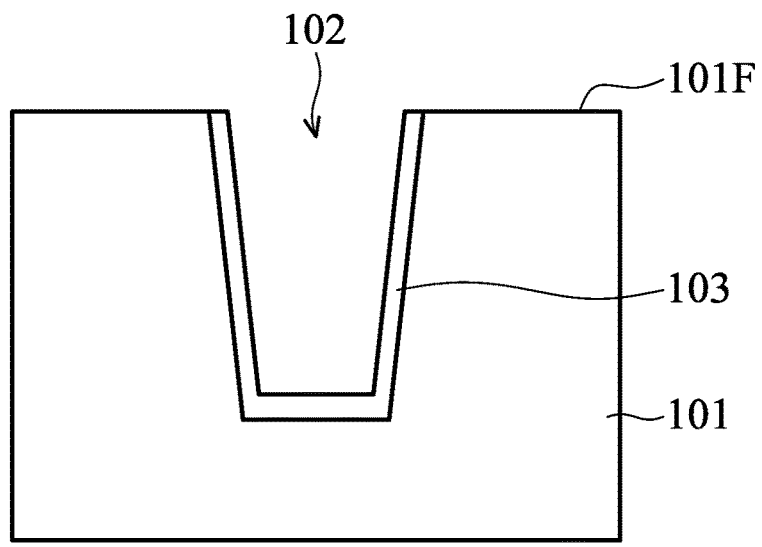

In some embodiments, as shown in FIG. 3, a planarization process is performed on the top surface 101F of the semiconductor substrate 101 to remove the semiconductor layer 103 outside of the hole 102, so that the top surface 101F of the semiconductor substrate 101 is exposed. The planarization process includes a chemical mechanical polishing (CMP) process, a grinding process, an etching process, another applicable process, or a combination thereof. In some embodiments, the step of performing the planarization process described above may be omitted since the layers outside of the hole 102 may be removed together in one planarization process after filling the hole 102, and the planarization process is performed until the top surface 101F of the semiconductor substrate 101 is exposed.

Figure 4:
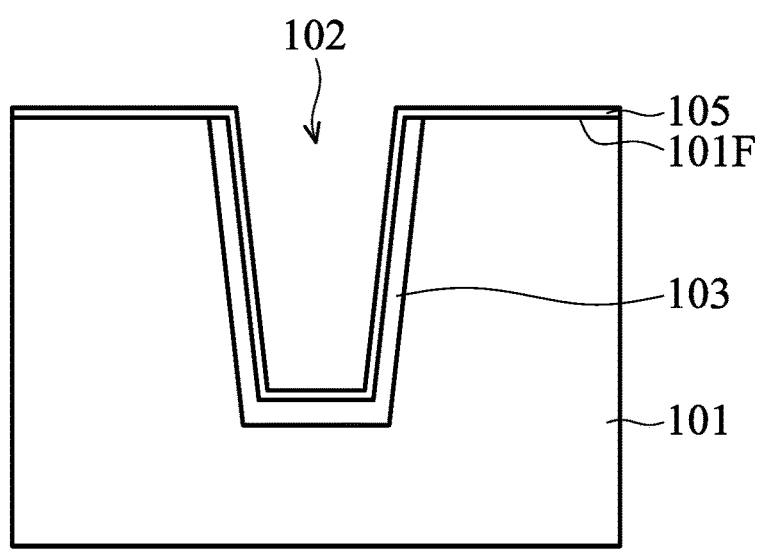
Figure 5:
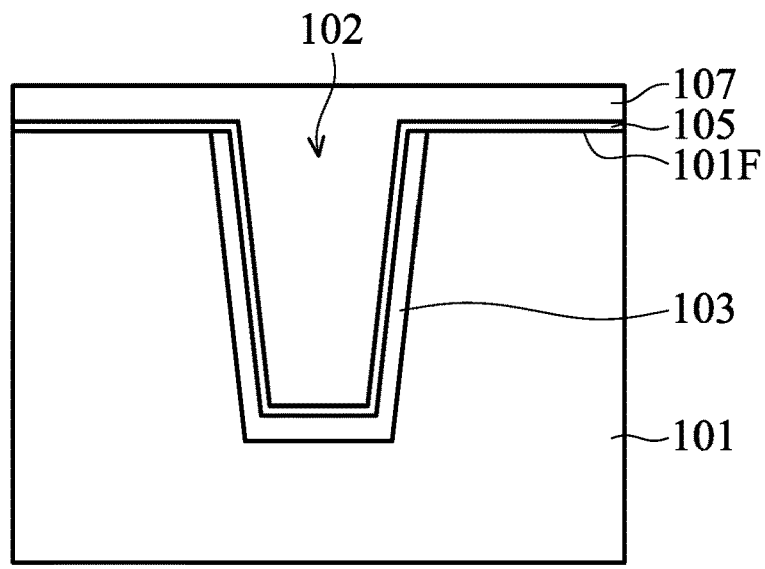

Next, as shown in FIG. 4, a barrier layer 105 is formed in the hole 102 and on the top surface 101F of the semiconductor substrate 101, and the barrier layer 105 is formed on the semiconductor layer 103. In particular, a portion of the barrier layer 105 is formed on the bottom surface of the hole 102. The purpose of forming the barrier layer 105 is to stably bond with a conductive layer 107 (as shown in FIG. 5) formed sequentially. In some embodiments, the barrier layer 105 is made of titanium (Ti) or titanium nitride (TiN), and the barrier layer 105 is formed by using a chemical vapor deposition (CVD) process, a flowable chemical vapor deposition (FCVD) process, an atomic layer deposition (ALD) process, a low-pressure chemical vapor deposition (LPCVD) process, a plasma enhanced chemical vapor deposition (PECVD) process, another applicable process, or a combination thereof.

As shown in FIG. 5, in accordance with some embodiments, the conductive layer 107 is formed in the hole 102 and on the top surface 101F of the semiconductor substrate 101, and the conductive layer 107 is formed on the semiconductor layer 103 and the barrier layer 105. In some embodiments, the conductive layer 107 includes metal or other applicable conductive materials, such as tungsten (W), copper (Cu), nickel (Ni), aluminum (Al), tungsten silicide (WSix), polysilicon, or a combination thereof. Moreover, the conductive layer 107 is formed by using a chemical vapor deposition (CVD) process, a flowable chemical vapor deposition (FCVD) process, an atomic layer deposition (ALD) process, a low-pressure chemical vapor deposition (LPCVD) process, a plasma enhanced chemical vapor deposition (PECVD) process, another applicable process, or a combination thereof.

Figure 6:
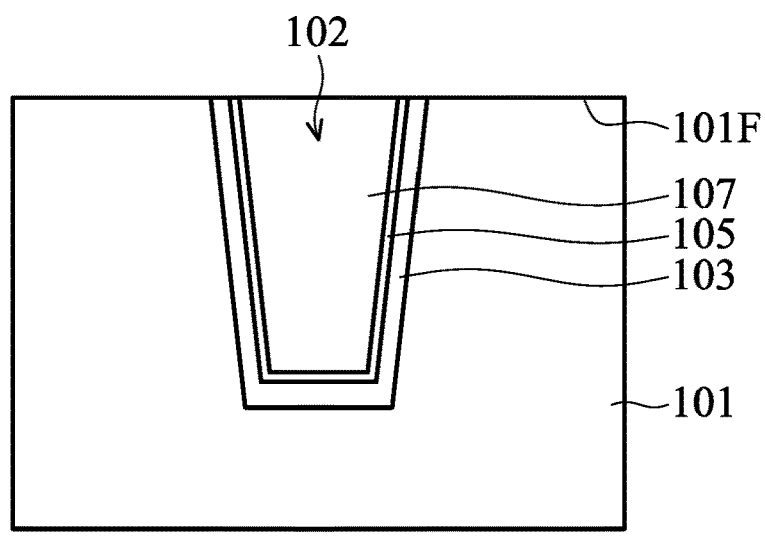

Next, as shown in FIG. 6, a first planarization process is performed on the top surface 101F of the semiconductor substrate 101 to remove the barrier layer 105 and the conductive layer 107 outside of the hole 102, so that the top surface 101F of the semiconductor substrate 101 is exposed. In some embodiments, the first planarization process includes a chemical mechanical polishing (CMP) process, a grinding process, an etching process, another applicable process, or a combination thereof.

Figure 7:
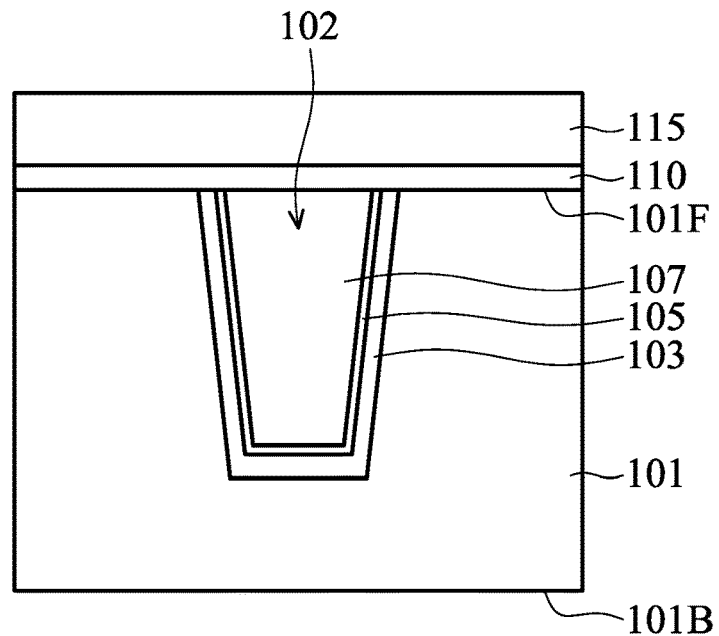

As shown in FIG. 7, in accordance with some embodiments, a first metal layer 110 is formed on the top surface 101F of the semiconductor substrate 101, and an electronic component 115 is formed on the first metal layer 110. In some embodiments, the electronic component 115 may include a single layer or multiple layers of conductive layers and a single layer or multiple layers of dielectric layers. After forming the first metal layer 110 and the electronic component 115, a carrier tap may be formed on the electronic component 115, so that a subsequent planarization process on the bottom surface 101B of the semiconductor substrate 101 can be performed conveniently.

Figure 8:
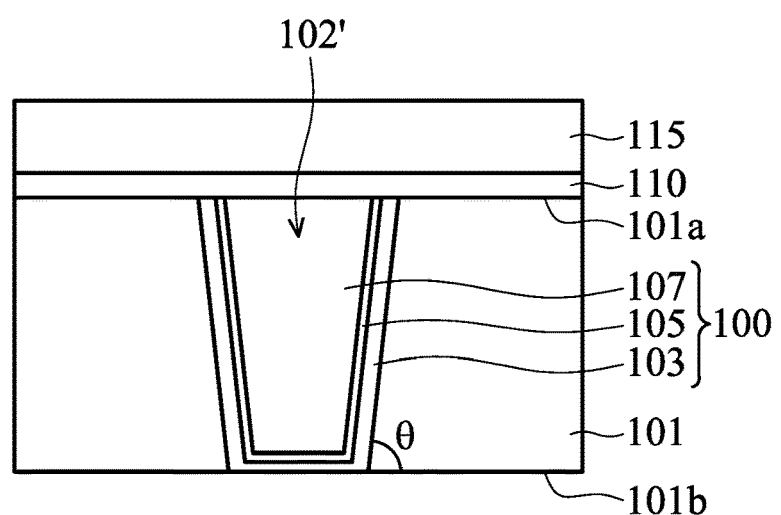

Next, as shown in FIG. 8, a second planarization process is performed on the bottom surface 101B of the semiconductor substrate 101 to remove a portion of the semiconductor substrate 101 located below the hole 102, so that a surface of the semiconductor substrate 101 is coplanar with the semiconductor layer 103 on the bottom surface of the hole 102. In some embodiments, a portion of the semiconductor layer 103 on the bottom surface of the hole 102 is further removed by the second planarization process, but the barrier layer 105 and the conductive layer 107 located on the semiconductor layer 103 and in the hole 102 are not exposed.

It is important to note that prior to the second planarization process, the semiconductor layer 103 on the bottom surface of the hole 102 has a thickness that is greater than the thickness of the other portion of the semiconductor layer 103. In some embodiments, after the second planarization process has been performed, the semiconductor layer 103 on the bottom surface of the hole 102 has a thickness that is greater than, equal to or smaller than the thickness of the other portion of the semiconductor layer 103. In addition, the second planarization process includes a chemical mechanical polishing (CMP) process, a grinding process, an etching process, another applicable process, or a combination thereof.

As shown in FIG. 8, in accordance with some embodiments, a through-substrate via structure 100 is formed after the second planarization process. The through-substrate via structure 100 has a through hole 102' penetrating from a first surface 101a of the semiconductor substrate 101 to an opposite second surface 101b of the semiconductor substrate 101. It is important to note that an acute angle 9 is included between the sidewall of the through hole 102' and the second surface 101b of the semiconductor substrate 101 on a side of the semiconductor substrate 101. The acute angle 9 is in a range from 60 degrees to 88 degrees. Furthermore, the semiconductor layer 103 is located inside the through hole 102' and interposed between the conductive layer 107 filling in the through hole 102' and the semiconductor substrate 101. Specifically, a portion of the semiconductor layer 103 is located below the conductive layer 107. In other words, the semiconductor layer 103 on the bottom surface of the through hole 102' is located below the conductive layer 107. In some embodiments, the barrier layer 105 is disposed between the semiconductor layer 103 and the conductive layer 107 to provide bonding assistance.

In some embodiments, the semiconductor layer 103 may be made of polysilicon. Since the material of the semiconductor layer 103 is the same as or similar to the material of the semiconductor substrate 101, while performing the second planarization process, the etching selectivity of the semiconductor layer 103 and the semiconductor substrate 101 to the grinding fluid are substantially the same, making it harder for uneven stress distribution to occur. Therefore, after the second planarization process has been performed, the conductive layer 107 that fills the through hole 102' may not be exposed, and the semiconductor layer 103 on the bottom surface of the through hole 102' is coplanar with the semiconductor substrate 101. In other words, the first surface 101a of the semiconductor substrate 101 is coplanar with the top surface of the through-substrate via structure 100 and is flat and even, and the second surface 101b of the semiconductor substrate 101 is coplanar with the bottom surface of the through-substrate via structure 100 and is flat and even. The conductive layer 107 does not protrude from the second surface 101b of the semiconductor substrate 101. Therefore, the probability of scratching the conductive layer 107 during the subsequent process or the delivery process can be reduced.

Figure 9:
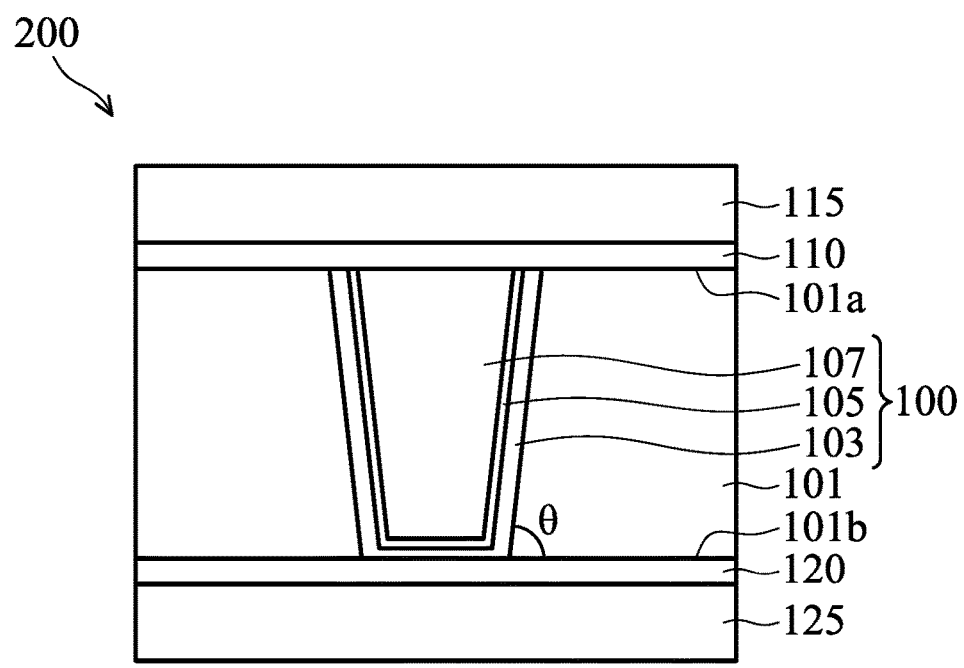
FIG. 9 is a cross-sectional view of a semiconductor device in accordance with some embodiments.

FIG. 9 is a cross-sectional view of a semiconductor device 200 in accordance with some embodiments.

As shown in FIG. 9, in accordance with some embodiments, after the second planarization process, a second metal layer 120 is formed on the through-substrate via structure 100, and another electronic component 125 is formed under the second metal layer 120. In some embodiments, the electronic component 125 may include a single layer or multiple layers of conductive layers and a single layer or multiple layers of dielectric layers. In some embodiments, the through-substrate via structure 100 is electrically connected to the electronic component 115 on the through-substrate via structure 100 through the first metal layer 110, and the through-substrate via structure 100 is electrically connected to the other electronic component 125 under the through-substrate via structure 100 through the second metal layer 120. Then, the formation of the semiconductor device 200 is complete.

In some embodiments, the first metal layer 110 and the second metal layer 120 may be made of CrAu, TiAu, TiNiAu, TiNiAg or a combination thereof. The first metal layer 110 and the second metal layer 120 may be formed by plating, chemical vapor deposition (CVD), physical vapor deposition (PVD), another applicable process, or a combination thereof. In some embodiments, the electronic components 115 and 125 may be two different portions of two different chips. In other embodiments, the electronic component 115 may be electrically connected to a portion of an integrated circuit, and the electrical component 125 may be electrically connected to a portion of another integrated circuit.

Embodiments of through-substrate via structures and methods for forming the same, and semiconductor devices having the foregoing through-substrate via structures are provided. The production of the voids inside the conductive layer filling the through hole and the voids inside the semiconductor layer surrounding the conductive layer can be reduced by the through hole with a tapered angle. Moreover, by disposing the semiconductor layer in the through hole and between the conductive layer and the semiconductor substrate, and utilizing the relationship of the same or similar materials inside and outside the through hole, the etching selectivity of the semiconductor layer and the semiconductor substrate to the grinding fluid are the same while performing the second planarization process, making it hard for uneven stress distribution to occur, and a flat and even surface of the semiconductor substrate can be produced after the second planarization process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A through-substrate via structure, comprising:
   a through hole penetrating from a first surface to an opposite second surface of a semiconductor substrate, and an acute angle is included between a sidewall of the through hole and the second surface on a side of the semiconductor substrate;
   a conductive layer that fills the through hole;
   a semiconductor layer disposed in the through hole and interposed between the conductive layer and the semiconductor substrate; and
   a barrier layer disposed between the conductive layer and the semiconductor layer.

2. The through-substrate via structure as claimed in claim 1, wherein the semiconductor layer surrounds the conductive layer, and a portion of the semiconductor layer is located below the conductive layer and is coplanar with the second surface.

3. The through-substrate via structure as claimed in claim 1, wherein the semiconductor layer is made of polysilicon.

4. The through-substrate via structure as claimed in claim 1, wherein the acute angle is in a range from 60 degrees to 88 degrees.

5. The through-substrate via structure as claimed in claim 1, wherein a portion of the barrier layer is located at a bottom of the through hole.

6. A semiconductor device, comprising:
   a through hole penetrating from a first surface to an opposite second surface of a semiconductor substrate, and an acute angle is included between a sidewall of the through hole and the second surface on a side of the semiconductor substrate;
   a conductive layer that fills the through hole;
   a semiconductor layer disposed in the through hole and interposed between the conductive layer and the semiconductor substrate;
   a first metal layer attached to the first surface and electrically connected to an electronic component; and
   a second metal layer attached to the second surface and electrically connected to another electronic component.

7. The semiconductor device as claimed in claim 6, wherein the semiconductor layer surrounds the conductive layer, and a portion of the semiconductor layer is located below the conductive layer and is coplanar with the second surface.

8. The semiconductor device as claimed in claim 6, wherein the semiconductor layer is made of polysilicon.

9. The semiconductor device as claimed in claim 6, wherein the acute angle is in a range from 60 degrees to 88 degrees.

10. The semiconductor device as claimed in claim 6, further comprising:
    a barrier layer disposed between the conductive layer and the semiconductor layer, and a portion of the barrier layer is located at the bottom of the through hole.

11. A method for forming a through-substrate via structure, comprising:
    forming a hole in a semiconductor substrate;
    forming a semiconductor layer on a sidewall and a bottom surface of the hole;
    forming a conductive layer on the semiconductor layer and the semiconductor substrate, wherein the conductive layer fills the hole;
    performing a first planarization process on a top surface of the semiconductor substrate to remove the conductive layer outside of the hole; and
    performing a second planarization process on a bottom surface of the semiconductor substrate to remove a portion of the semiconductor substrate, such that a surface of the semiconductor substrate is coplanar with the semiconductor layer on the bottom surface of the hole,
    wherein an acute angle is included between the sidewall of the hole and the surface of the semiconductor substrate on a side of the semiconductor substrate.

12. The method as claimed in claim 11, wherein the semiconductor layer on the bottom surface of the hole has a thickness that is greater than the thickness of the other portion of the semiconductor layer before performing the second planarization process.

13. The method as claimed in claim 11, wherein a thickness of the semiconductor layer on the bottom surface of the hole is further thinned by the second planarization process.

14. The method as claimed in claim 11, wherein the conductive layer is not exposed after performing the second planarization process.

15. The method as claimed in claim 11, further comprising:
    forming a barrier layer on the semiconductor layer and the semiconductor substrate after forming the semiconductor layer and before forming the conductive layer, wherein a portion of the barrier layer is formed on the bottom surface of the hole.

* * * * *